US009896885B2

(12) United States Patent
Blake et al.

(10) Patent No.: US 9,896,885 B2
(45) Date of Patent: Feb. 20, 2018

(54) HYDRAULIC TOOLS INCLUDING REMOVABLE COATINGS, DRILLING SYSTEMS, AND METHODS OF MAKING AND USING HYDRAULIC TOOLS

(71) Applicant: Baker Hughes Incorporated, Houston, TX (US)

(72) Inventors: Christopher W. Blake, Celle (DE); Carsten Voss, Hannover (DE)

(73) Assignee: Baker Hughes Incorporated, Houston, TX (US)

(*) Notice: Subject to any disclaimer, the term of this patent is extended or adjusted under 35 U.S.C. 154(b) by 109 days.

(21) Appl. No.: 14/965,158

(22) Filed: Dec. 10, 2015

(65) Prior Publication Data
US 2017/0167199 A1    Jun. 15, 2017

(51) Int. Cl.
*F04C 2/107* (2006.01)
*F04C 18/107* (2006.01)
(Continued)

(52) U.S. Cl.
CPC .............. *E21B 4/02* (2013.01); *F01C 1/101* (2013.01); *F04C 2/1073* (2013.01);
(Continued)

(58) Field of Classification Search
CPC . E21B 4/02; C23C 16/44; F01C 1/101; F04C 2/1071–2/1078; F04C 18/1075;
(Continued)

(56) References Cited

U.S. PATENT DOCUMENTS 3,028,338 A    4/1962  Parker, Jr.
5,554,020 A *  9/1996  Rao .................... F01C 21/104
                                                418/178
(Continued)

FOREIGN PATENT DOCUMENTS

WO          02077459 A1   10/2002
WO        2014164485 A1   10/2014
WO        2015027169 A1    2/2015

OTHER PUBLICATIONS

International Search Report for International Application No. PCT/US2016/065797 dated Mar. 7, 2017, 4 pages.
(Continued)

*Primary Examiner* — Laert Dounis
(74) *Attorney, Agent, or Firm* — TraskBritt

(57) ABSTRACT

A hydraulic tool includes a stator, a rotor, and a removable coating. At least one of the stator and the rotor comprises a resilient material. The removable coating has a thickness selected to compensate for expected swelling of the resilient material or an expected contraction of a clearance between the rotor and the stator based on thermal expansion. The removable coating is disposed on a surface of at least one of the rotor and the stator, and the removable coating is formulated to be removed during operation of the hydraulic tool. A method of operating a hydraulic tool includes passing a fluid through the hydraulic tool during rotation of the rotor within the stator and removing at least a portion of the removable coating responsive to rotation of the rotor within the stator as a volume of the resilient material increases responsive to contact with the fluid passing through the hydraulic fluid.

20 Claims, 5 Drawing Sheets

(51) Int. Cl.
  *E21B 4/02* (2006.01)
  *F01C 1/10* (2006.01)
  *C23C 16/44* (2006.01)

(52) U.S. Cl.
  CPC ........ *F04C 2/1075* (2013.01); *F04C 18/1075* (2013.01); *C23C 16/44* (2013.01); *Y10T 29/49242* (2015.01)

(58) Field of Classification Search
  CPC .............. F04C 2240/10; F04C 2240/20; F04C 2240/801; F04C 2240/802; F04C 2230/91; Y10T 29/49242
  USPC ..................................................... 418/48–53
  See application file for complete search history.

(56) References Cited

U.S. PATENT DOCUMENTS

| | | | |
|---|---|---|---|
| 6,309,195 B1 | 10/2001 | Bottos et al. | |
| 6,457,958 B1 * | 10/2002 | Dunn | F04C 2/1071 418/1 |
| 6,568,076 B2 | 5/2003 | Bottos et al. | |
| 6,604,922 B1 | 8/2003 | Hache | |
| 6,688,867 B2 * | 2/2004 | Suman | F04C 18/086 418/178 |
| 6,881,045 B2 | 4/2005 | Zitka et al. | |
| 6,944,935 B2 | 9/2005 | Hache | |
| 7,192,260 B2 | 3/2007 | Lievestro et al. | |
| 7,517,202 B2 | 4/2009 | Delpassand | |
| 7,528,533 B2 | 5/2009 | Ochi et al. | |
| 8,337,182 B2 | 12/2012 | Lee et al. | |
| 8,444,901 B2 | 5/2013 | Sindt et al. | |
| 8,777,598 B2 | 7/2014 | Akbari et al. | |
| 8,985,977 B2 | 3/2015 | Hohl et al. | |
| 2001/0005486 A1 | 6/2001 | Wood | |
| 2003/0138338 A1 | 7/2003 | Plop et al. | |
| 2003/0192184 A1 | 10/2003 | Hache | |
| 2005/0079083 A1 | 4/2005 | Lievestro et al. | |
| 2008/0050259 A1 | 2/2008 | Hooper | |
| 2009/0152009 A1 | 6/2009 | Slay et al. | |
| 2012/0018227 A1 | 1/2012 | Puzz et al. | |
| 2012/0102738 A1 | 5/2012 | Akbari et al. | |
| 2012/0148432 A1 | 6/2012 | Butuc et al. | |
| 2013/0149182 A1 | 6/2013 | Sreshta et al. | |
| 2013/0251572 A1 | 9/2013 | Butuc | |
| 2014/0064997 A1 | 3/2014 | Hohl et al. | |
| 2015/0022051 A1 | 1/2015 | Meng et al. | |
| 2015/0122549 A1 | 5/2015 | Hohl et al. | |
| 2015/0139842 A1 * | 5/2015 | Bratu | F04C 2/1071 418/48 |
| 2015/0192123 A1 | 7/2015 | Lehr et al. | |

OTHER PUBLICATIONS

International Written Opinion for International Application No. PCT/US2016/065797 dated Mar. 7, 2017, 5 pages.

Christopher W. Blake & Carsten Voss, Corresponding PCT Application No. PCT/US2016/065797, filed Dec. 9, 2016, entitled Hydraulic Tools Including Removable Coatings, Drilling Systems, and Methods of Making and Using Hydraulic Tools.

* cited by examiner

HYDRAULIC TOOLS INCLUDING REMOVABLE COATINGS, DRILLING SYSTEMS, AND METHODS OF MAKING AND USING HYDRAULIC TOOLS

FIELD

Embodiments of the present disclosure relate generally to hydraulic tools, such as drilling motors and pumps, to drilling systems that include hydraulic tools, and to methods of forming and using such tools and systems.

BACKGROUND

To obtain hydrocarbons such as oil and gas from subterranean formations, wellbores are drilled into the subterranean formations by rotating a drill bit attached to an end of a drill string. A substantial portion of current drilling activity involves what is referred to in the art as "directional" drilling. Directional drilling involves drilling deviated and/or horizontal wellbores. Modern directional drilling systems generally employ a bottom hole assembly (BHA) at the end of the drill string that includes a drill bit and a hydraulically actuated motor to drive rotation of the drill bit. The drill bit is coupled to a drive shaft of the motor, typically through an assembly configured for steering the path of the drill bit, and drilling fluid pumped through the motor (and to the drill bit) from the surface drives rotation of the drive shaft to which the drill bit is attached. Such hydraulic motors are commonly referred to in the drilling industry as "mud motors," "drilling motors," and "Moineau motors." Such motors are referred to hereinafter as "hydraulic drilling motors."

Hydraulic drilling motors include a power section that contains a stator and a rotor disposed in the stator. The stator may include a metal housing that is lined inside with a helically contoured or lobed elastomeric material. The rotor is usually made from a suitable metal, such as steel, and has an outer lobed surface. Pressurized drilling fluid (commonly referred to as "drilling mud") is pumped into a progressive cavity formed between the rotor and the stator lobes. The force of the pressurized fluid pumped into and through the cavity causes the rotor to turn in a planetary-type motion. A suitable shaft and a flexible coupling compensate for eccentric movement of the rotor. The shaft is coupled to a bearing assembly having a drive shaft (also referred to as a "drive sub"), which rotates the drill bit through the aforementioned steering assembly.

As drilling fluid flows through the progressive cavity between the rotor and the stator, forces on the rotor and the stator, as well as abrasives in the drilling fluid, can damage parts of the motor. The motor may include a resilient portion (e.g., an elastomeric or rubber portion), typically as part of the stator, which is designed to wear. The elastomeric portion may be replaced after a certain amount of use, or when a selected amount of wear or damage is detected.

The resilient portion typically swells under conditions encountered in drilling operations, such as due to chemical interaction with drilling fluids, thermal effects, or other factors. Such swelling changes the spacing and fit of the rotor with the stator. Metal parts of the motor may also expand with temperature, further changing the spacing and fit of the rotor with the stator. Hydraulic drilling motors may typically be made with rotors slightly undersized to allow room for the resilient portion of the stator to swell, and the motors may be operated at relatively lower pressures and lower power until the resilient portion of the motor swells enough to form a seal at full operating pressure. For example, a motor may be operated for thirty (30) to sixty (60) minutes at low-pressure, break-in conditions, before operation at the motor's design conditions. Downhole pressure may counteract some of the swelling effect by compressing the resilient portion of the motor.

BRIEF SUMMARY

In some embodiments, a hydraulic tool includes a stator having a bore configured as a plurality of lobes, a rotor having at least one lobe on an exterior surface, and a removable coating. At least one of the stator and the rotor comprises a resilient material. The rotor is configured to rotate within the stator responsive to fluid flow through the stator. The removable coating is disposed on a surface of at least one of the rotor and the stator, and the removable coating is formulated to be removed during operation of the hydraulic tool. The removable coating has a thickness selected to compensate for at least one of an expected swelling of the resilient material during a drilling operation or an expected contraction of a clearance between the rotor and the stator based on thermal expansion of the rotor and the stator.

In some embodiments, a method of operating a hydraulic tool includes coupling a hydraulic tool to a drill string. The hydraulic tool comprises a stator defining a plurality of lobes, a rotor defining at least one lobe and configured to rotate within the stator, and a removable coating. At least one of the stator and the rotor comprises a resilient material. The removable coating is formulated to be removed during operation of the hydraulic tool. The rotor is configured to rotate within the stator responsive to fluid flow through the stator. The method further includes passing a fluid through the hydraulic tool during rotation of the rotor within the stator, and removing at least a portion of the removable coating responsive to rotation of the rotor within the stator as a volume of the resilient material increases responsive to contact with the fluid passing through the hydraulic fluid. The removable coating has a thickness selected to compensate for at least one of an expected swelling of the resilient material during a drilling operation or an expected contraction of a clearance between the rotor and the stator based on thermal expansion of the rotor and the stator.

In certain embodiments, a method of forming a hydraulic tool includes attaching a removable coating to a surface of a rotor, and disposing the rotor with the removable coating attached thereto within a stator. The stator includes a resilient material defining a plurality of lobes. The removable coating has a thickness selected to compensate for at least one of an expected swelling of the resilient material during a drilling operation or an expected contraction of a clearance between the rotor and the stator based on thermal expansion of the rotor and the stator. The removable coating is formulated to be removed during operation of the hydraulic tool.

BRIEF DESCRIPTION OF THE DRAWINGS

While the specification concludes with claims particularly pointing out and distinctly claiming what are regarded as embodiments of the present disclosure, various features and advantages of embodiments of the disclosure may be more readily ascertained from the following description of example embodiments of the disclosure when read in conjunction with the accompanying drawings, in which:

DETAILED DESCRIPTION

The illustrations presented herein are not actual views of any particular hydraulic tool, rotor, stator, hydraulic drilling motor, hydraulic pump, or drilling system, but are merely idealized representations that are employed to describe example embodiments of the present disclosure. Additionally, elements common between figures may retain the same numerical designation.

The present disclosure includes hydraulic tools (e.g., drilling motors, progressive cavity pumps, etc.) each having a stator and a rotor. As used herein, the term "hydraulic tool" means and includes apparatus which converts fluid flow to mechanical energy, or which applies mechanical energy to cause a flow of fluid. The stator may include a resilient material formulated and configured to swell during operation of the tool. The rotor may have a coating formulated and configured to be removed during operation of the tool. The presence of the coating may allow the tool to operate at design conditions before the resilient material swells or before metal portions of the tool expand due to temperature. That is, as the resilient material swells, the coating may be removed at a rate approximately equal to the rate of swelling and/or thermal expansion, such that a gap between the rotor and the stator may remain at an approximately constant size (as measured, e.g., as a volume of fluid within the stator, as a maximum distance between an outer surface of the rotor and an inner surface of the stator in a plane transverse to the axis of rotation, etc.). Furthermore, the materials of the motor may be compressed to some extent at downhole pressures, and the resilient material typically experiences greater compression than metal portions of the motor. Balancing the effects of swelling, thermal expansion, compression, and removal of the coating may tend to keep the gap or clearance between the stator and the rotor approximately constant during the initial period of operation. Thus, the motor may reach full operating pressures and flow rates without a break-in period at lower pressure.

Figure 1A:
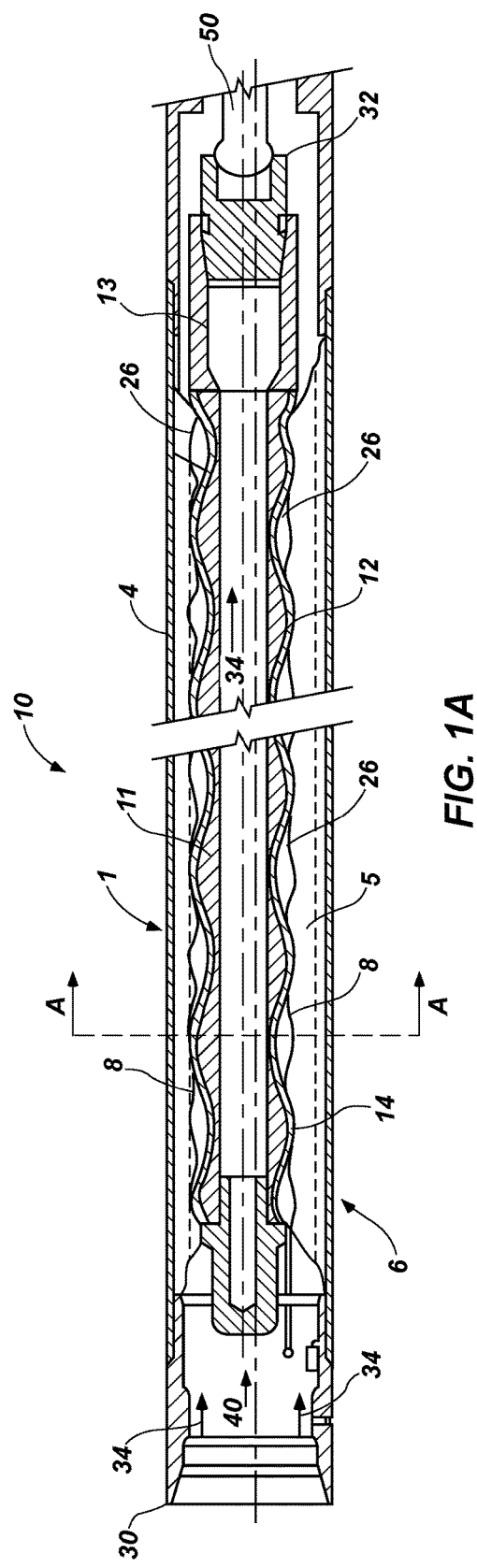
FIGS. 1A and 1B are simplified cross-sectional side views illustrating an embodiment of a hydraulic tool according to the present disclosure.
Figure 1B:
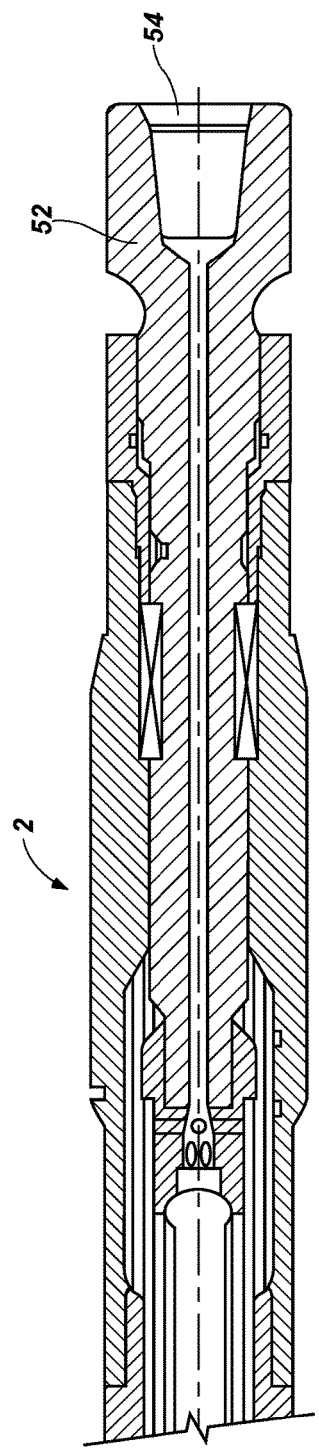

Referring to FIGS. 1A and 1B, a hydraulic drilling motor 10 includes a power section 1 and a bearing assembly 2. The power section 1 includes an elongated metal housing 4, having a resilient material 5 therein that has a helically lobed inner surface 8. The resilient material 5 is secured inside the metal housing 4, for example, by adhesively bonding the resilient material 5 within the interior of the metal housing 4. The resilient material 5 is a material that exhibits elastic behavior and is able to return to its original shape after being elastically deformed. The resilient material 5 may include, for example, a polymer such as a fluorosilicone rubber (FVMQ, e.g., a copolymer of fluorovinyl and methyl siloxane), nitrile butadiene rubber (NBR), a fluoroelastomer (FKM, e.g., a fluorocarbon copolymer, terpolymer, pentamer, etc.), hydrogenated nitrile butadiene rubber (HNBR), fluorinated ethylene propylene (FEP), vinyl methyl polysiloxane (VMQ), carboxylated nitrile butadiene rubber (XNBR), polyacrylate acrylic rubber (ACM), a perfluoroelastomer (FFKM), ethylene propylene rubber (EPM), ethylene propylene diene monomer rubber (EPDM), or acrylic ethylene copolymer (AEM). The resilient material 5 and the metal housing 4 together form a stator 6.

A rotor 11 is rotatably disposed within the stator 6 and configured to rotate therein responsive to the flow of drilling fluid (e.g., a liquid or a suspension of solid particulate matter in a liquid) through the hydraulic drilling motor 10. The rotor 11 may include an elongated metal core 13 that has a helically lobed outer surface 12 configured to engage with the helically lobed inner surface 8 of the stator 6. The rotor 11 may include a coating material 14 thereon. The coating material 14 may be secured over the metal core 13, for example, by adhesively bonding the coating material 14 over the exterior of the metal core 13. The coating material 14 may have a durability lower than a durability of the resilient material 5, such that when a gap or clearance between the rotor 11 and stator 6 changes due to swelling of the resilient material, thermal expansion of the metal components, and/or compression due to downhole pressure, the coating material 14 may wear away. As used herein, the term "durability" means and includes the ability of a material to withstand degradation through wear, such as through mechanisms of abrasion and erosion. When two materials having different durability contact one another, the material having a lower durability wears preferentially (i.e., at a faster rate than the material having a higher durability). Though depicted in FIGS. 1A and 1B on the metal core 13 of the rotor 11, the coating material 14 may, in some embodiments, be disposed on a surface of the stator 6, in addition to or instead of on the rotor 11. In certain embodiments, the rotor may include a resilient material, such as the resilient material 5 described with respect to the stator 6.

In some embodiments, a hardfacing material, a resilient material, or another material may be disposed between the coating material 14 and the rotor 11. Such materials may have higher durability than the coating material 14. For example, a hardfacing material on the rotor 11 may include chrome, nickel, cobalt, tungsten carbide, diamond, diamond-like carbon, boron carbide, cubic boron nitride, nitrides, carbides, oxides, borides, and alloys hardened by nitriding, boriding, carbonizing or any combination of these materials. Hardfacing may be applied pure or as a composite in a binder matrix. Hardfacing materials on rotors are described in U.S. Patent Application Publication No. 2012/0018227, published Jan. 26, 2012, and titled "Components and Motors for Downhole Tools and Methods of Applying Hardfacing to Surfaces Thereof," the entire disclosure of which is hereby incorporated by reference. In some embodiments, hardfacing materials may be disposed on surfaces of the stator 6.

The outer surface 12 of the rotor 11 and the inner surface 8 of the stator 6 may have similar, but slightly different profiles. For example, the outer surface 12 of the rotor 11 may have one fewer lobe than the inner surface 8 of the stator 6. The outer surface 12 of the rotor 11 and the inner surface 8 of the stator 6 may be configured so that seals are established between the rotor 11 and the stator 6 at discrete intervals along and circumferentially around the interface therebetween, resulting in the creation of fluid chambers or cavities 26 between the outer surface 12 of the rotor 11 and the inner surface 8 of the stator 6. The cavities 26 may be filled with a pressurized drilling fluid 40 (FIG. 1A).

As the pressurized drilling fluid 40 flows from a top 30 to a bottom 32 of the power section 1, as shown by flow arrow 34, the pressurized drilling fluid 40 causes the rotor 11 to rotate within the stator 6. The number of lobes and the geometries of the outer surface 12 of the rotor 11 and inner surface 8 of the stator 6 may be modified to achieve desired input and output requirements and to accommodate different drilling operations. The rotor 11 may be coupled to a flexible shaft 50, and the flexible shaft 50 may be connected to a drive shaft 52 in the bearing assembly 2. As previously mentioned, a drill bit may be attached to the drive shaft 52. For example, the drive shaft 52 may include a threaded box 54, and a drill bit may be provided with a threaded pin that may be engaged with the threaded box 54 of the drive shaft 52.

Figure 2A:
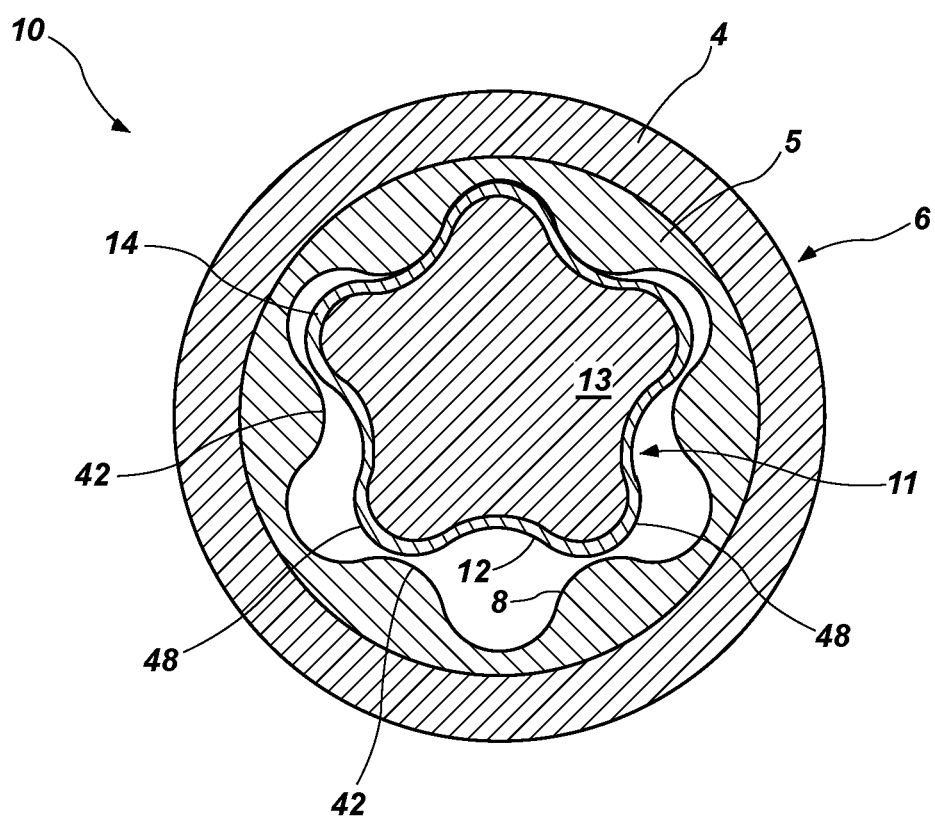
FIG. 2A is a simplified transverse cross-sectional view of a portion of the hydraulic tool shown in FIGS. 1A and 1B taken along section line A-A therein.

FIG. 2A is a cross-sectional view of the stator 6 and the rotor 11 of the hydraulic drilling motor 10 taken at section line A-A of FIG. 1A. As shown in FIG. 2A, the inner surface of the metal housing 4 and the outer surface of the resilient material 5 may each be approximately cylindrical or tubular. The inner surface 8 of the stator 6 shown in FIG. 2A includes lobes 42 (six lobes in the embodiment shown in FIG. 2A), which may be configured to interface with lobes 48 of the rotor 11 (five lobes in the embodiment shown in FIG. 2A). As the rotor 11 rotates, the lobes 48 of the rotor 11 move into and out of the spaces between the lobes 42 of the stator 6. As the rotor 11 rotates, portions of the stator 6 and/or the rotor 11 experience stresses. If the stator 6 includes a resilient material 5, the resilient material 5 may be designed to deform and rebound as the rotor 11 rotates.

Figure 3A:
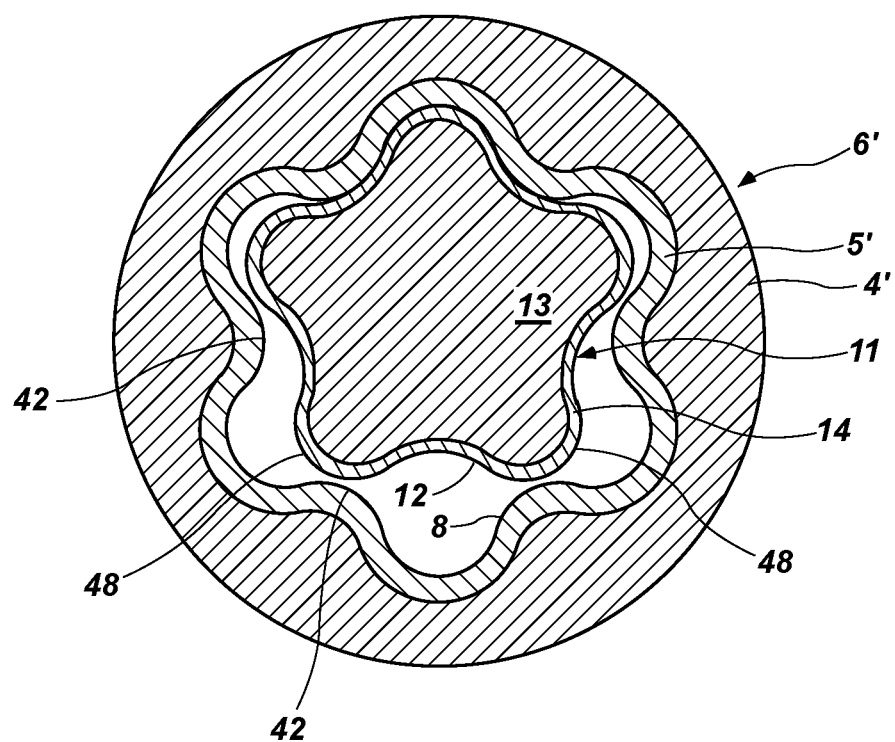
FIG. 3A is a simplified transverse cross-sectional view of a portion of another hydraulic tool.

FIG. 3A illustrates a cross-sectional view of another stator 6'. The stator 6' includes a metal housing 4' and a resilient material 5'. As shown in FIG. 3A, the inner surface of the metal housing 4' and the outer surface of the resilient material 5' may each be shaped to approximately correspond to the shape of the inner surface 8 of the stator 6', which may be the same shape as the inner surface 8 of the stator 6 shown in FIG. 2A. That is, the thickness of the resilient material 5' may be approximately uniform, and the shape of the inner surface 8 may be based on the shape of the inner surface of the metal housing 4'. The stator 6' may be referred to as "pre-contoured" because the shape of the inner surface 8 of the stator 6' is defined before application of the resilient material 5'. The stator 6' may be used in a hydraulic drilling motor 10 (FIG. 1A), as described above with respect to the stator 6 in reference to FIG. 2A. That is, fluid flowing through the stator 6' may cause the rotor 11 to rotate.

Other rotor and stator designs that may be used in conjunction with the present disclosure are described in U.S. Patent Application Publication 2015/0192123, "Hydraulic Tools Including Inserts and Related Methods," published Jul. 9, 2015; U.S. Patent Application Publication 2015/0122549, "Hydraulic Tools, Drilling Systems Including Hydraulic Tools, and Methods of Using Hydraulic Tools," published May 7, 2015; and U.S. Patent Application Publication 2014/0064997, "Asymmetric Lobes for Motors and Pumps," published Mar. 6, 2014; the entire disclosure of each of which is incorporated herein by this reference.

As shown in FIGS. 2A and 3A, the rotor 11 may include a removable coating material 14 over the metal core 13. The outer surface 12 of the rotor 11 may coincide with the outer surface of the coating material 14. The coating material 14 may be a material formulated and configured to be removed during operation of the hydraulic drilling motor 10 (e.g., during a drilling operation). The coating material 14 may include a ceramic, a metal, a polymer (e.g., an elastomer), or any other selected material. The coating material 14 may be removed during operation by abrasion, fracturing, tearing, peeling, blistering, thermal decomposition, chemical degradation, electrical degradation, or any other method or combination of methods. The thickness of the coating material 14 may be selected as a function of the expected swelling of the resilient material 5 and expansion of the metal core 13 and metal housing 4, 4'. In some embodiments, the thickness of the coating material 14 may be approximately uniform. In other embodiments, the thickness of the coating material 14 may vary to accommodate different amounts of swelling of the resilient material 5 (e.g., the coating material 14 may be thicker where the coating material 14 contacts the lobes 42 of the resilient material 5).

In some embodiments, the coating material 14 may include a material formulated to decompose when exposed to preselected conditions or to preselected conditions for a period of time. For example, in some embodiments, the coating material 14 may decompose when exposed to a temperature of at least about 200° C. for a period of at least about 30 minutes, a temperature of at least about 150° C. for a period of at least about 45 minutes, or a temperature of at least about 100° C. for a period of at least about 60 minutes. In other embodiments, the coating material 14 may decompose at a temperature less than 300° C., or even a temperature less than 400° C. In some embodiments, the coating material 14 may decompose when exposed to a particular solvent or other chemical species, or when an electrical charge is applied to the coating material 14.

In some embodiments, the coating material 14 may include a material formulated to be removed from the rotor 11 by mechanical means, such as abrasion, fracturing, tearing, peeling, or blistering. For example, as the rotor 11 rotates within the stator 6, 6', the rotor 11 may push the coating material 14 against the resilient material 5, 5', causing stresses on the coating material 14. The amount of deterioration of the coating material 14 may be a function of the operating conditions (e.g., pressure, temperature, rotations per minute, etc.) and operating time.

The coating material 14 may include, for example, an oil-based or water-based paint that has been applied in a thin coat and dried. The coating material 14 may include various filler and matrix materials to exhibit a selected bond strength, durability, etc. A bond strength between the coating material 14 and the rotor 13 may be measured as described in ASTM D4541-09e1, "Standard Test Method for Pull-Off Strength of Coatings Using Portable Adhesion Testers," (ASTM Int'l, 2009), or in ASTM D1062-08, "Standard Test Method for Cleavage Strength of Metal-to-Metal Adhesive Bonds," (ASTM Int'l, 2015). For example, the coating material 14 may have a bond strength with the rotor 13 from about 0.05 MPa (7.3 psi) to about 20.0 MPa (2,900 psi), such as from about 0.1 MPa (14.5 psi) to about 2 MPa (290 psi), from about 0.5 MPa (72.5 psi) to about 1.5 MPa (218 psi), or from about 5 MPa (725 psi) to about 10 MPa (1,450 psi).

In some embodiments, the coating material 14 may be inspected by applying a dye to the surface of the coating material 14. After a period of time, the dye may be removed. If the coating material 14 has cracks or other defects, some of the dye may remain therein, and may be identifiable by visual inspection. Test methods and materials are described, for example, in U.S. Pat. No. 3,028,338, granted Apr. 3, 1962, and titled "Composition for Detecting Surface Discontinuities," the entire disclosure of which is hereby incorporated by reference. The coating material 14 may also be inspected by other methods, such as microscopy.

In some embodiments, the coating material 14 may be applied over another material (e.g., a primer).

In some embodiments, the coating material 14 may include a polymer material, such as a polyurethane, a polyether, a polycarbonate, a polyamide, a thermoplastic, an epoxy, rubber (natural or synthetic), etc. Such materials may exhibit a wide variety of properties, and such properties may be selected based on the particular conditions the coating material 14 is expected to encounter. For example, the properties of the coating material 14 may vary based on the type of polymer material, amount and identity of additives (e.g., plasticizers, fillers, curatives, etc.), coating material 14 thickness, curing conditions, etc.

Figure 2B:
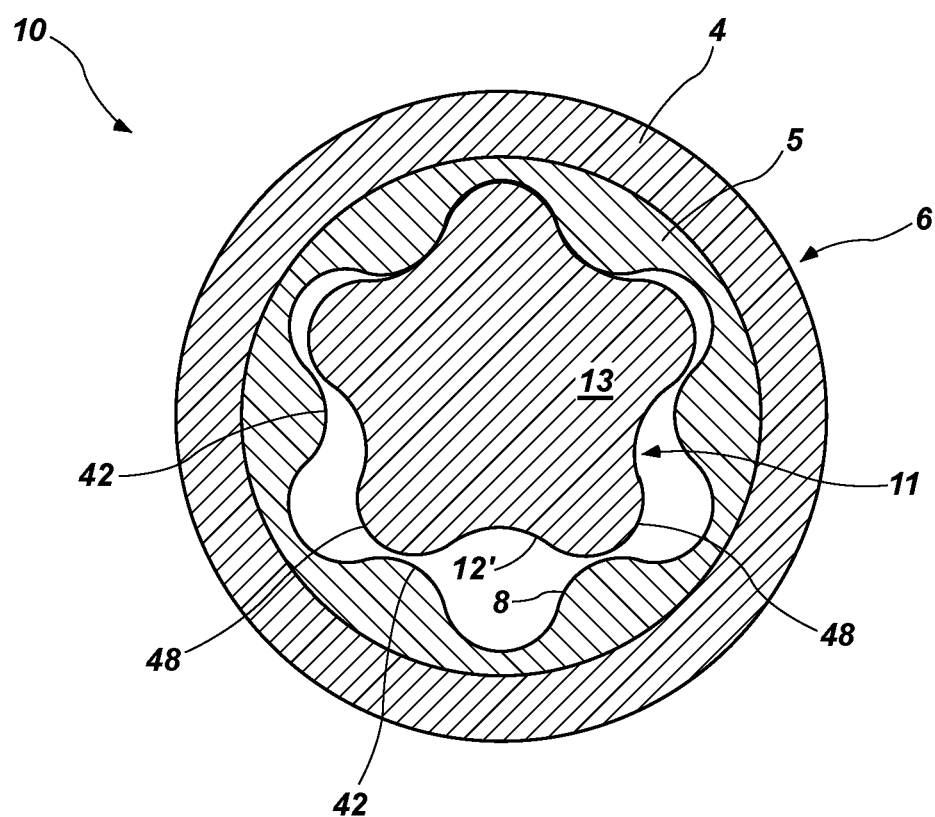
FIG. 2B is a simplified transverse cross-sectional view of the hydraulic tool shown in FIGS. 1A and 1B after the hydraulic tool has been in operation for a period of time.
Figure 3B:
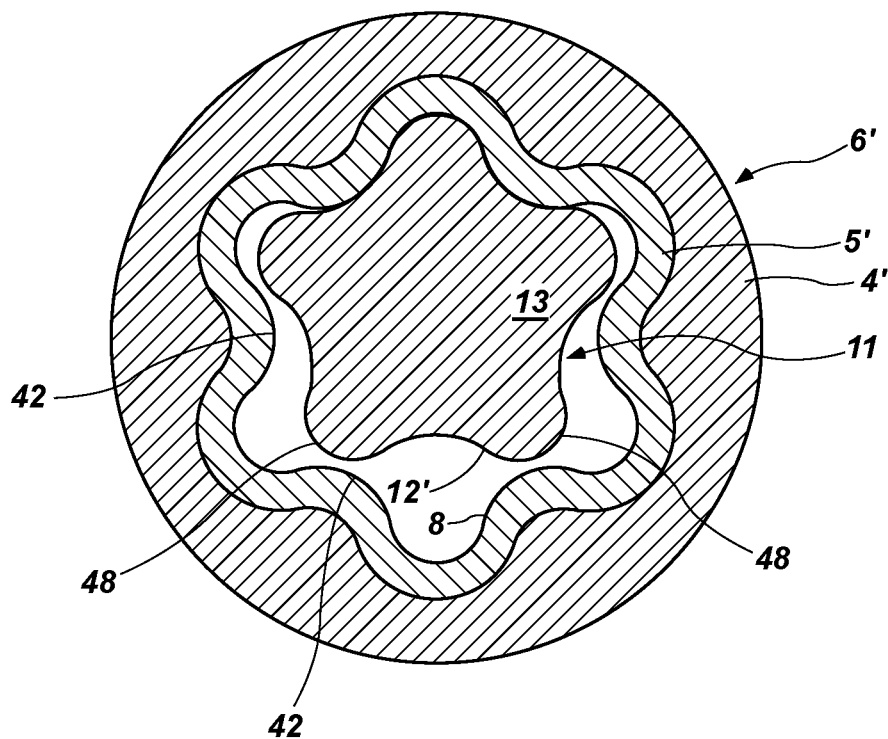
FIG. 3B is a simplified transverse cross-sectional view of the hydraulic tool shown in FIG. 3A, after the hydraulic tool has been in operation for a period of time.

The coating material 14 may be formulated and configured to decompose and be removed from the rotor 11 as the resilient material 5, 5' expands or swells during operation of the hydraulic drilling motor 10. The increase in thickness of the resilient material 5, 5' due to swelling may be up to about 2% of the initial thickness of the resilient material 5, 5', up to about 5% of the initial thickness of the resilient material 5, 5', up to about 7% of the initial thickness of the resilient material 5, 5', or even up to about 10% of the initial thickness of the resilient material 5, 5'. FIGS. 2B and 3B illustrate the rotor 11 and stator 6, 6' after a period of time in operation. As shown in FIGS. 2B and 3B, the coating material 14 may at least partially decompose and be removed from the rotor 11. The outer surface of the metal core 13 may be the outer surface 12' of the rotor 11 after removal of the coating material 14. The resilient material 5, 5' may expand such that spacing (e.g., a gap or clearance) between the rotor 11 and the stator 6, 6' at a selected time after operations have begun is approximately equal to the spacing between the rotor 11 and the stator 6, 6' at the start of drilling (as in FIGS. 2A and 3A). That is, the increase in thickness of the resilient material 5, 5' due to swelling plus the expansion of the metal core 13 and metal housing 4, 4' may approximately equal the thickness of the coating material 14 removed. For example, the resilient material 5, 5' may be expected to swell up to about 2 mm (0.08 in), up to about 1 mm (0.04 in), or up to about 0.7 mm (0.028 in). In such embodiments, the hydraulic drilling motor 10 may be operated at approximately the same conditions (e.g., pressure, fluid flow rate, rotational velocity, torque, etc.) when the coating material 14 is present (FIGS. 2A and 3A) as when the coating material 14 has been removed (FIGS. 2B and 3B). Thus, the hydraulic drilling motor 10 may not require a break-in period, during which conventional hydraulic drilling motors operate at relatively lower pressures to prevent blow-by between a rotor and stator.

For example, in some embodiments, fluid may flow through the hydraulic drilling motor 10 at a first temperature, a first pressure, and a first flow rate at the beginning of operations (i.e., before the resilient material 5, 5' swells and before any significant amount of the coating material 14 is removed). Later, the fluid may flow through the hydraulic drilling motor 10 at a second temperature, a second pressure, and a second flow rate (i.e., after the resilient material 5, 5' swells and after all or a portion of the coating material 14 is removed). However, the first temperature may be approximately equal to the second temperature, the first pressure may be approximately equal to the second pressure, and the first flow rate may be approximately equal to the second flow rate, such that no significant changes in motor operation or output are required. For example, the second temperature may be within about ±20% of the first temperature, within about ±10% of the first temperature, within about ±5% of the first temperature, or even within about ±2% of the first temperature (based on absolute temperature (Kelvin)). The second pressure may be within about ±20% of the first pressure, within about ±10% of the first pressure, within about ±5% of the first pressure, or even within about ±2% of the first pressure. The second flow rate may be within about ±20% of the first flow rate, within about ±10% of the first flow rate, within about ±5% of the first flow rate, or even within about ±2% of the first flow rate.

Coating materials 14 including polymers may be particularly susceptible to thermal degradation, which may enable controlled removal of the coating material 14 by controlling the conditions within the hydraulic drilling motor 10. For example, the hydraulic drilling motor 10 may be operated at a temperature below a degradation temperature of a polymeric coating material 14 for a certain period of time while the resilient material 5, 5' swells. Once the resilient material 5, 5' has swollen to a selected degree, the temperature of the hydraulic drilling motor may be increased to increase the degradation rate of the coating material 14.

In some embodiments, the coating material 14 may be exposed to a chemical species to increase the degradation rate. For example, a solvent may be added to drilling fluid flowing through the hydraulic drilling motor 10 at a selected time during a drilling operation. Decomposition of the coating material 14 by exposure to high temperatures or chemical components may operate in conjunction with degradation by mechanical means (e.g., by abrasion). For example, mechanical forces on the coating material 14 may cause cracks or fissures into which chemical species may flow.

The coating material 14 may be removed from the rotor 11 in pieces, or may peel from the rotor 11 in a single action. As the coating material 14 is removed, it may flow from the hydraulic drilling motor 10 as part of the drilling fluid. Removal of the coating material 14 may limit or prevent damage to the resilient material 5, 5' that may occur in conventional motors when the resilient material swells and the metal core 13 and metal housing 4, 4' expand.

As discussed above, the coating material 14 on the rotor 11 may have a thickness approximately corresponding to an expected change in thickness of the resilient material 5, 5'. For example, the coating material 14 may have a thickness up to about 2 mm (0.08 in), up to about 1 mm (0.04 in), or up to about 0.7 mm (0.028 in). In some embodiments, the coating material 14 may have a thickness of about 0.5 mm (0.02 in).

Although the present disclosure has been described in terms of hydraulic drilling motors, it is understood that similar devices may operate as hydraulic pumps by driving rotation of the drive shaft to pump hydraulic fluid through the body of the pump. Thus, embodiments of the disclosure may also apply to such hydraulic pumps, and to systems and devices including such hydraulic pumps.

Additional non-limiting example embodiments of the disclosure are described below.

Embodiment 1

A hydraulic tool comprising a stator having a bore configured as a plurality of lobes, a rotor having at least one lobe on an exterior surface, and a removable coating. The rotor is configured to rotate within the stator responsive to fluid flow through the stator. At least one of the stator and the rotor comprises a resilient material. The removable coating is disposed on a surface of at least one of the rotor and the stator, and the removable coating is formulated to be removed during operation of the hydraulic tool. The removable coating has a thickness selected to compensate for at least one of an expected swelling of the resilient material during a drilling operation or an expected contraction of a clearance between the rotor and the stator based on thermal expansion of the rotor and the stator.

Embodiment 2

The hydraulic tool of Embodiment 1, wherein the removable coating comprises a material formulated to decompose at a temperature of less than about 300° C.

Embodiment 3

The hydraulic tool of Embodiment 1 or Embodiment 2, wherein the removable coating has a durability lower than a durability of the resilient material.

Embodiment 4

The hydraulic tool of any of Embodiments 1 through 3, wherein the removable coating comprises a material selected from the group consisting of ceramics, metals, and polymers.

Embodiment 5

The hydraulic tool of any of Embodiments 1 through 4, wherein the removable coating is disposed on a surface of the rotor. The stator comprises at least a portion of the resilient material.

Embodiment 6

The hydraulic tool of any of Embodiments 1 through 5, wherein the stator comprises a metal housing surrounding the resilient material.

Embodiment 7

The hydraulic tool of Embodiment 6, wherein an interface between the metal housing and the resilient material is generally cylindrical.

Embodiment 8

The hydraulic tool of Embodiment 6, wherein an interface between the metal housing and the resilient material defines the plurality of lobes.

Embodiment 9

The hydraulic tool of any of Embodiments 1 through 8, wherein the resilient material comprises a material selected from the group consisting of fluorosilicone rubber, nitrile butadiene rubber, fluoroelastomers, hydrogenated nitrile butadiene rubber, fluorinated ethylene propylene, vinyl methyl polysiloxane, carboxylated nitrile butadiene rubber, polyacrylate acrylic rubber, perfluoroelastomers, ethylene propylene rubber, ethylene propylene diene monomer rubber, and acrylic ethylene copolymer.

Embodiment 10

The hydraulic tool of any of Embodiments 1 through 9, further comprising a hardfacing material disposed on at least one of an outer surface of the rotor and an inner surface of the stator, wherein the hardfacing material comprises a material selected from the group consisting of chrome, nickel, cobalt, tungsten carbide, diamond, diamond-like carbon, boron carbide, cubic boron nitride, nitrides, carbides, oxides, borides, and alloys hardened by nitriding, boriding, or carbonizing.

Embodiment 11

A method of operating a hydraulic tool, comprising coupling a hydraulic tool to a drill string. The hydraulic tool comprises a stator defining a plurality of lobes, a rotor defining at least one lobe and configured to rotate within the stator, and a removable coating. At least one of the stator and the rotor comprises a resilient material. The removable coating is formulated to be removed during operation of the hydraulic tool. The rotor is configured to rotate within the stator responsive to fluid flow through the stator. The method further includes passing a fluid through the hydraulic tool during rotation of the rotor within the stator, and removing at least a portion of the removable coating responsive to rotation of the rotor within the stator as a volume of the resilient material increases responsive to contact with the fluid passing through the hydraulic fluid. The removable coating has a thickness selected to compensate for at least one of an expected swelling of the resilient material during a drilling operation or an expected contraction of a clearance between the rotor and the stator based on thermal expansion of the rotor and the stator.

Embodiment 12

The method of Embodiment 11, wherein removing the removable coating from the rotor comprises at least one of chemically, thermally, or electrically decomposing the removable coating.

Embodiment 13

The method of Embodiment 11 or Embodiment 12, wherein removing the removable coating from the rotor comprises abrading the removable coating from the rotor.

Embodiment 14

The method of any of Embodiments 11 through 13, wherein removing the removable coating from the rotor comprises maintaining an approximately constant clearance between the stator and the rotor.

Embodiment 15

The method of any of Embodiments 11 through 14, wherein passing a fluid through the hydraulic tool to rotate the rotor within the stator comprises passing the fluid at a first temperature, a first pressure, and a first flow rate before increasing the volume of the resilient material; and passing the fluid at a second temperature, a second pressure, and a second flow rate after increasing the volume of the resilient material. The first temperature is approximately equal to the second temperature, the first pressure is approximately equal to the second pressure, and the first flow rate is approximately equal to the second flow rate.

Embodiment 16

The method of any of Embodiments 11 through 14, wherein passing a fluid through the hydraulic tool to rotate the rotor within the stator comprises passing the fluid at a first pressure before increasing the volume of the resilient material, and passing the fluid at a second pressure after increasing the volume of the resilient material. The second pressure is within about ±20% of the first pressure.

Embodiment 17

The method of Embodiment 16, wherein the second pressure is within about ±5% of the first pressure.

Embodiment 18

A method of forming a hydraulic tool, comprising attaching a removable coating to a surface of a rotor and disposing the rotor with the removable coating attached thereto within a stator. The stator comprises a resilient material defining a plurality of lobes. The removable coating has a thickness selected to compensate for at least one of an expected swelling of the resilient material during a drilling operation or an expected contraction of a clearance between the rotor and the stator based on thermal expansion of the rotor and the stator. The removable coating is formulated to be removed during operation of the hydraulic tool.

Embodiment 19

The method of Embodiment 18, wherein attaching a removable coating to a surface of a rotor comprises attaching the removable coating to the surface of the rotor with a bond strength from about 0.05 MPa to about 20.0 MPa.

Embodiment 20

The method of Embodiment 18 or Embodiment 19, wherein the removable coating comprises a material formulated to decompose at a temperature of less than about 300° C.

While the present disclosure may be susceptible to various modifications and alternative forms, specific embodiments have been shown by way of example in the drawings and have been described in detail herein. However, it should be understood that the disclosure is not limited to the particular forms disclosed. Rather, the disclosure includes all modifications, equivalents, legal equivalents, and alternatives falling within the scope of the disclosure as defined by the appended claims. Further, embodiments of the disclosure have utility with different and various hydraulic tool types and configurations.

What is claimed is:

1. A hydraulic tool, comprising:
   a stator having a bore configured as a plurality of lobes;
   a rotor having at least one lobe on an exterior surface, the rotor configured to rotate within the stator responsive to fluid flow through the stator;
   at least one of the stator and the rotor comprising a resilient material; and
   a removable coating disposed on a surface of at least one of the rotor and the stator, the removable coating having a thickness selected to compensate for at least one of an expected swelling of the resilient material during a drilling operation or an expected contraction of a clearance between the rotor and the stator based on thermal expansion of the rotor and the stator, the removable coating formulated to be removed during operation of the hydraulic tool.

2. The hydraulic tool of claim 1, wherein the removable coating comprises a material formulated to decompose at a temperature of less than about 300° C.

3. The hydraulic tool of claim 1, wherein the removable coating has a durability lower than a durability of the resilient material.

4. The hydraulic tool of claim 1, wherein the removable coating comprises a material selected from the group consisting of ceramics, metals, and polymers.

5. The hydraulic tool of claim 1, wherein:
   the removable coating is disposed on a surface of the rotor; and
   the stator comprises the resilient material.

6. The hydraulic tool of claim 1, wherein the stator comprises a metal housing surrounding the resilient material.

7. The hydraulic tool of claim 6, wherein an interface between the metal housing and the resilient material is generally cylindrical.

8. The hydraulic tool of claim 6, wherein an interface between the metal housing and the resilient material defines the plurality of lobes.

9. The hydraulic tool of claim 1, wherein the resilient material comprises a material selected from the group consisting of fluorosilicone rubber, nitrile butadiene rubber, fluoroelastomers, hydrogenated nitrile butadiene rubber, fluorinated ethylene propylene, vinyl methyl polysiloxane, carboxylated nitrile butadiene rubber, polyacrylate acrylic rubber, perfluoroelastomers, ethylene propylene rubber, ethylene propylene diene monomer rubber, and acrylic ethylene copolymer.

10. The hydraulic tool of claim 1, further comprising a hardfacing material disposed on at least one of an outer surface of the rotor and an inner surface of the stator, wherein the hardfacing material comprises a material selected from the group consisting of chrome, nickel, cobalt, tungsten carbide, diamond, diamond-like carbon, boron carbide, cubic boron nitride, nitrides, carbides, oxides, borides, and alloys hardened by nitriding, boriding, or carbonizing.

11. A method of operating a hydraulic tool, comprising:
   coupling a hydraulic tool to a drill string, the hydraulic tool comprising:
      a stator defining a plurality of lobes;
      a rotor defining at least one lobe and configured to rotate within the stator, the rotor configured to rotate within the stator responsive to fluid flow through the stator;
      at least one of the stator and the rotor comprising a resilient material; and
      a removable coating disposed on a surface of at least one of the rotor and the stator, the removable coating having a thickness selected to compensate for at least one of an expected swelling of the resilient material during a drilling operation or an expected contraction of a clearance between the rotor and the stator based on thermal expansion of the rotor and the stator, the removable coating formulated to be removed during operation of the hydraulic tool;
   passing a fluid through the hydraulic tool during rotation of the rotor within the stator; and
   removing at least a portion of the removable coating responsive to rotation of the rotor within the stator as a volume of the resilient material increases responsive to contact with the fluid passing through the hydraulic tool.

12. The method of claim 11, wherein removing at least a portion of the removable coating comprises at least one of chemically, thermally, or electrically decomposing the removable coating.

13. The method of claim 11, wherein removing at least a portion of the removable coating comprises abrading the removable coating from the rotor.

14. The method of claim 11, wherein removing at least a portion of the removable coating comprises maintaining an approximately constant clearance between the stator and the rotor compensating for the expected swelling of the resilient material or the expected contraction of the clearance between the rotor and the stator based on thermal expansion of the rotor and the stator.

15. The method of claim 11, wherein passing the fluid through the hydraulic tool to rotate the rotor within the stator comprises passing the fluid at a first temperature, a first pressure, and a first flow rate before increasing the volume of the resilient material, and passing the fluid at a second temperature, a second pressure, and a second flow rate after increasing the volume of the resilient material or contracting the clearance between the rotor and the stator based on thermal expansion of the rotor and the stator, wherein the first temperature is approximately equal to the second temperature, the first pressure is approximately equal to the second pressure, and the first flow rate is approximately equal to the second flow rate.

16. The method of claim 11, wherein passing the fluid through the hydraulic tool during rotation of the rotor within the stator comprises:
  passing the fluid at a first pressure before increasing the volume of the resilient material; and
  passing the fluid at a second pressure after increasing the volume of the resilient material;
  wherein the second pressure is within about ±20% of the first pressure.

17. The method of claim 16, wherein the second pressure is within about ±5% of the first pressure.

18. A method of forming a hydraulic tool, comprising:
  attaching a removable coating to a surface of a rotor, wherein the removable coating has a thickness selected to compensate for at least one of an expected swelling of the resilient material during a drilling operation or an expected contraction of a clearance between the rotor and a stator based on thermal expansion of the rotor and the stator, the removable coating formulated to be removed during operation of the hydraulic tool; and
  disposing the rotor with the removable coating attached thereto within the stator, the stator comprising a resilient material defining a plurality of lobes.

19. The method of claim 18, wherein attaching the removable coating to the surface of the rotor comprises attaching the removable coating to the surface of the rotor with a bond strength from about 0.05 MPa to about 20.0 MPa.

20. The method of claim 18, wherein the removable coating comprises a material formulated to decompose at a temperature of less than about 300° C.

* * * * *